(12) United States Patent
Baumann et al.

(10) Patent No.: US 9,934,840 B2
(45) Date of Patent: Apr. 3, 2018

(54) METHOD AND CIRCUIT ENABLING FERROELECTRIC MEMORY TO BE FIXED TO A STABLE STATE

(71) Applicant: TEXAS INSTRUMENTS INCORPORATED, Dallas, TX (US)

(72) Inventors: Robert C. Baumann, Dallas, TX (US); John A. Rodriguez, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/642,375

(22) Filed: Mar. 9, 2015

(65) Prior Publication Data

US 2015/0262641 A1 Sep. 17, 2015

Related U.S. Application Data

(60) Provisional application No. 61/951,285, filed on Mar. 11, 2014.

(51) Int. Cl.
*G11C 11/22* (2006.01)
(52) U.S. Cl.
CPC ...... *G11C 11/2275* (2013.01); *G11C 11/2273* (2013.01)

(58) Field of Classification Search
CPC .. G11C 11/22; G11C 11/2273; G11C 11/2275
USPC .................................. 365/145, 211
See application file for complete search history.

(56) References Cited

U.S. PATENT DOCUMENTS

| | | | | |
|---|---|---|---|---|
| 5,953,245 | A | * | 9/1999 | Nishimura ............ G11C 11/005 365/145 |
| 7,085,150 | B2 | | 8/2006 | Rodriguez et al. |
| 7,729,156 | B2 | | 6/2010 | Rodriguez et al. |
| 2006/0002171 | A1 | * | 1/2006 | Gudesen ................. G11C 11/22 365/145 |
| 2007/0058416 | A1 | * | 3/2007 | Hikosaka ................ G11C 11/22 365/145 |
| 2008/0175133 | A1 | * | 7/2008 | Roelofs .................. B82Y 10/00 369/126 |

* cited by examiner

*Primary Examiner* — Han Yang
*Assistant Examiner* — Jerome Leboeuf
(74) *Attorney, Agent, or Firm* — Gregory J. Albin; Charles A. Brill; Frank D. Cimino

(57) ABSTRACT

A system includes a ferroelectric random access memory (FRAM) array having one or more memory elements. A cycle controller cycles data to be fixed in a subset of the one or more memory elements by reading or writing the data a predetermined number of times to fix the data to a non-volatile stable state.

3 Claims, 2 Drawing Sheets

METHOD AND CIRCUIT ENABLING FERROELECTRIC MEMORY TO BE FIXED TO A STABLE STATE

CROSS-REFERENCE TO RELATED APPLICATION

This application claims the benefit of U.S. Provisional Patent Application 61/951,285 filed on 11 Mar. 2014, and entitled METHOD AND CIRCUIT ENABLING FERROELECTRIC MEMORY TO BE FIXED TO A MORE STABLE STATE, the entirety of which is incorporated by reference herein.

TECHNICAL FIELD

This disclosure relates to memory circuits, and more particularly to a ferroelectric memory having data that is fixed to a stable state.

BACKGROUND

Ferroelectric RAM (also referred to as FeRAM, F-RAM or FRAM) is a random-access memory similar in construction to DRAM but uses a ferroelectric material layer instead of a dielectric layer to achieve non-volatility. The FRAM is one of a growing number of alternative non-volatile random-access memory technologies that offer the same functionality as flash memory. However, FRAM offers advantages over flash that include that include lower power usage, faster write performance, and a much greater maximum number of write-erase cycles, for example.

Ferroelectric material in the FRAM has a nonlinear relationship between the applied electric field and the apparent stored charge. Specifically, the ferroelectric characteristic of the material has the form of a hysteresis loop, which is very similar in shape to the hysteresis loop of ferromagnetic materials. The dielectric constant of a ferroelectric material is typically much higher than that of a linear dielectric because of the effects of semi-permanent electric dipoles formed in the crystal structure of the ferroelectric material. When an external electric field is applied across a dielectric, the dipoles in the material tend to align themselves with the field direction, produced by small shifts in the positions of atoms and shifts in the distributions of electronic charge in the crystal structure. After the charge is removed, the dipoles retain their polarization state, where binary "0"s and "1"s are stored as one of two possible electric polarizations in each data storage cell. Over extreme environmental conditions and/or over time however, stored data in FRAM material can be lost.

In high-reliability (automotive, medical, space, and so forth) non-volatile (NV) memory applications, stable memory technologies are needed where data is preserved regardless of the underlying time (e.g., time between accesses or time in one particular data state) or conditions involved. In many systems, the memory is used to store a set of critical system values that once written are never changed. In many of these systems, a read only memory (ROM) may be a better solution except that the data that would be stored in ROM is often not determined or known until the product is made and the final application software revised or optimized. In such cases, a reliable non-volatile memory is needed.

SUMMARY

This disclosure relates to a ferroelectric memory having data that is fixed to a stable state. In one aspect, a system includes a ferroelectric random access memory (FRAM) array having one or more memory elements. A cycle controller cycles data to be fixed in a subset of the one or more memory elements by reading or writing the data a predetermined number of times to fix the data to a non-volatile stable state.

In another aspect, a circuit includes a ferroelectric random access memory (FRAM) array having one or more memory elements. A cycle controller cycles the data to be fixed in in a subset of the one or more memory elements by reading or writing the data a predetermined number of times to fix the data to a non-volatile stable state. A heater controlled by the cycle controller heats the FRAM array to a predetermined temperature to facilitate fixing the data in fewer cycles to read or write the data the predetermined number of times.

In yet another aspect, a method includes applying heat to a ferroelectric random access memory (FRAM) array having one or more memory elements to store data. The method includes increasing an operating voltage above a nominal voltage setting to read or write to the one or more memory cells. The method includes cycling the data to be fixed in the subset of the one or more memory elements by reading the data a predetermined number of times to fix the data to a non-volatile condition.

DETAILED DESCRIPTION

Figure 1:
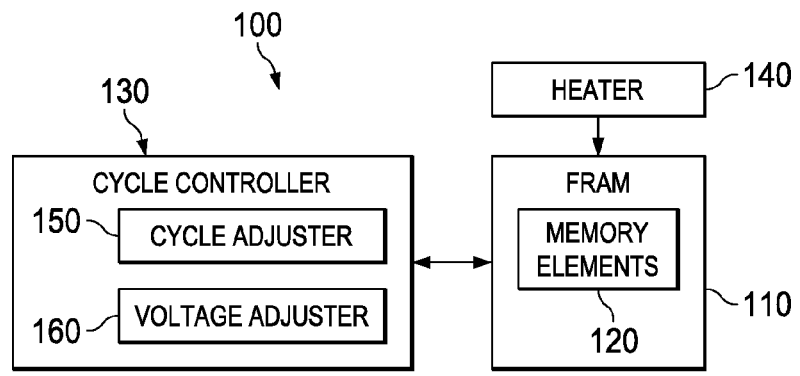
FIG. 1 illustrates an example a system to fix data to a non-volatile stable state in a ferroelectric random access memory.

This disclosure relates to a ferroelectric memory having data that is fixed to a non-volatile stable state. A system and/or circuit can be provided that includes a ferroelectric random access memory (FRAM) array having one or more memory elements to store data, where the data can be cycled at elevated temperatures and/or voltages to place the FRAM into the non-volatile stable state in an efficient manner. A cycle controller cycles the data stored in a subset of the one or more memory elements (e.g., where subset includes all or a portion of the FRAM) by reading or writing the data a predetermined number of times to fix the data to the non-volatile stable state. A heater can be provided that heats the FRAM array to a predetermined temperature to facilitate fixing the data in fewer cycles to read or write the data the predetermined number of times. A voltage adjuster can also be provided that allows reading or writing of the FRAM memory cells above the nominal access range to also facilitate fixing the data in a faster cycle time to read or write the data the predetermined number of times. It is noted that the term "fixing" relates to the conversion of a non-volatile (NV) FRAM that can be read and written to a permanent state non-volatile FRAM that now operates like a read only memory (ROM) where writes can no longer change the state of the memory that has been fixed as disclosed herein. Thus, non-volatile after fixing is the property of being fixed in a preferred state, based on the cycling, voltage, and/or temperature methods disclosed herein such that the FRAM can be read but no longer written, and thus the fixed data is more stable than in the un-modified non-volatile FRAM where the data may still be over-written.

Existing FRAM technology can be employed and cycled via the cycle controller to act as a programmable memory and thus can be changed at any time until data is "fixed" by multiple read (or write) cycling at elevated temperatures and/or voltages. This allows flexibility while developing final products/applications in that the data in the FRAM is fully reprogrammable until it is "fixed" by the cycling process disclosed herein. Also, since both temperature and cycling can be utilized to fix the stored bits in a stable non-volatile condition, small sections of memory can be fixed while leaving the remainder of the memory in its original (e.g., bistable) random access form. Conventional ROM technologies are stable but the final values must be ready when the ROM is made (e.g., it is not programmable after the fact). Thus, in many systems, the values are not finalized until production and/or are part specific (e.g., trim bits) thus a ROM solution is not viable. Using FRAM with data cycling allows the FRAM to be used as a programmable non-volatile memory while having a subset or the entire address space fixed in a more stable "ROM state" at any time after the chip/system is up and running. This allows substantial optimization capability (prior to fixing the data) and enhanced stability after the data is fixed in FRAM by the systems, circuits, and processes described herein.

FIG. 1 illustrates an example a system 100 to fix data to a non-volatile stable state in a ferroelectric random access memory (FRAM) 110. The FRAM 110 can include one or more memory elements 120 to store data and can be fixed to a stable non-volatile condition as disclosed herein. In some examples, all of the FRAM 110 can be set to a fixed non-volatile condition. In other examples, a subset of the memory elements 120 can be fixed with the remaining subset left in its native random access form. As used herein, the term subset can include all or a portion of the memory elements 120 in the FRAM 110. A cycle controller 130 cycles the data to be fixed in a subset of the one or more memory elements 120 by reading or writing the data a predetermined number of times to fix the data to a non-volatile stable state. As used herein, the term cycles the data can apply when the data was stored prior to the cycling. Another possibility cycling the data applies to the case where is the data is being written for the first time, and it is then written (or read) repeatedly a predetermined number of times. Another possibility is the data is read out from the respective memory elements 120, placed in a temporary buffer, and then written back (or read from) repeatedly a predetermined number of cycles.

Typically, cycling involves reading of the FRAM 110 and respective memory elements 120. As used herein, the term reading involves applying a voltage to the memory elements 120 and sensing the data state of the memory element. Similarly, writing also involves applying a voltage to the respective memory element 120 to place it in a known data state such as a "0" state or a "1" state. A heater 140 can be provided to heat the FRAM array 110 to a predetermined temperature to facilitate fixing the data to a non-volatile state in fewer read or write cycles to read or write the data the predetermined number of times. As will be illustrated and described below with respect to FIG. 2, the heater can be an external heater that applies heat externally to a package that houses the FRAM array 110. In another example, the heater 140 can be a resistive heating element that applies heat within a package (or to a socket holding the package) that houses the FRAM array 110. In another example, the heater 140 can be a resistive heating element that resides on an integrated circuit die that provides heat to one or more of the memory elements 120 (e.g., silicon resistor or transistor that is heated next to a memory element in circuit). The heater 140 can supply heat that is above an ambient temperature of the FRAM array 110, where the temperature above the ambient temperature of the FRAM array can be within a range of about 85 degrees Celsius to about 200 degrees Celsius, for example.

The cycle controller 130 can include a cycle adjuster 150 that indicates a number of times to cycle the data stored in a subset of the one or more memory elements by reading or writing the data. For example, the cycle adjuster 150 can specify a range of about 5 cycles to about 10,000 cycles to the cycle controller 130. The cycle controller 130 can also include a voltage adjuster 160 to set a programming read or write voltage applied to the one or more memory elements 120 to an elevated voltage above a nominal voltage setting to facilitate fixing the data in fewer cycles to read or write the data the predetermined number of times. For example, the voltage adjuster 160 can set the programming read or write voltage applied to the one or more memory elements 120 to an elevated voltage in the range of about ten percent above the nominal voltage setting to less than a breakdown voltage setting for the one or more memory cells, where breakdown setting refers to a voltage that will cause a failure in the respective memory element 120.

As noted above, the heater 140 can be provided as a chip socket, an embedded package, or integrated heater element to raise the FRAM 110 temperature above its normal operating range (but not high enough to cause a hard failure in the FRAM). Concurrently, the FRAM 110 can be accessed with repetitive read cycles (or write cycles) to allow the cycle controller 130 to "fix" the data states stored in memory elements 120 such that they are thermodynamically stable. After being exposed to higher temperatures and a number of identical memory read or write cycles, the data in memory elements is "fixed" or imprinted such that the opposite data state is no longer stable, thus substantially only the original data in the memory is recalled, even if the bits are accidently overwritten with the wrong data, since only the fixed data state is now stable (after cycling), where the bits quickly revert to the original fixed data state. Thus, the FRAM 110 that has been fixed acts as a read only memory (ROM) since the bistable nature of the memory is transformed into a single preferred stable state (if the opposite state is written into the cell, it automatically reverts to the state which was imprinted) by the fixing process. The heater 140 can be used to accelerate the imprinting process. Additionally, a higher voltage can be used during the repetitive read or write cycles to further accelerate the imprinting. At high temperature and higher voltage, this imprinting process can be achieved in a plurality of read cycles (e.g., 5 to 10,000) representing seconds or minutes of real time to achieve the stable fixing of the FRAM 110.

In one dedicated example implementation, a cycle memory port could be defined where only a small subset of memory elements 120 are defined for the port and can be employed to allow read or write cycling at much higher frequencies thus significantly cutting down the fixing time. Since the extra port may utilize additional area, in this implementation only a small part of the memory would be of this type and only used to store critical system variables that are usually stored in ROM. One advantage of this capability would be achieved in a single process technology not requiring extra components (such as fuses, ROM, OTP, and so forth). Additionally, the FRAM 110 can act as a non-volatile programmable memory until critical code had been finalized then the desired section of FRAM defined as the stress port could be converted to ROM-like memory with the aforementioned fixing process.

Figure 2:
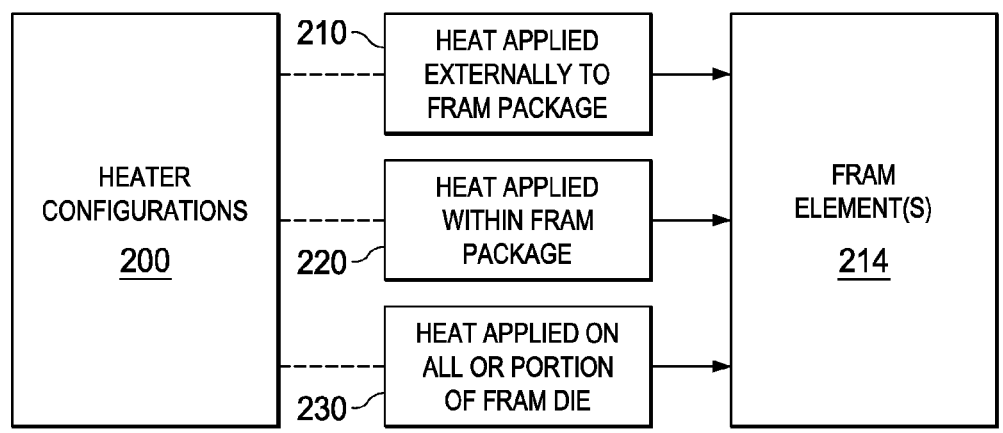
FIG. 2 illustrates example heater configurations for a system to fix data to a non-volatile stable state in a ferroelectric random access memory.

FIG. 2 illustrates example heater configurations 200 for a system to fix data to a non-volatile stable state in a ferroelectric random access memory. In one example configuration 200, the heater is an external heater that applies heat externally at 210 to a package that houses the FRAM array and memory elements 214. For example, a set of FRAM arrays could be placed into a heating chamber while the cycling/fixing processes described herein were applied. In another example, the heater could be a resistive heating element that applies heat within a package at 220 that houses the FRAM array and memory elements 214. For example, a ceramic or plastic package could have an internal heating element built therein. Also, heat could be applied to a chip socket that the FRAM array was plugged into. In yet another example, the heater can be a resistive heating element that resides on an integrated circuit die at 230 that provides heat to one or more of the memory elements. For example, a resistor, diode, or transistor could be heated in circuit to heat all or portion of the FRAM array. As noted previously, the respective heater configurations 200 can supply heat that is above an ambient temperature of the FRAM array, where the temperature above the ambient temperature of the FRAM array is within a range of about 85 degrees Celsius to about 200 degrees Celsius.

In other examples, ceramic heaters that can be placed on top of a packaged chip which can raise the temperature up to 200 or 300 degrees Celsius, for example. This would allow a normal (room temperature) ambient with local heating as another approach. Another heating method could be a heating lamp which can achieve high temperatures within seconds. This would resemble a rapid thermal anneal process. In the case of external heaters, fixing procedures could be applied at product test where the ambient is at room temperature.

Figure 3:
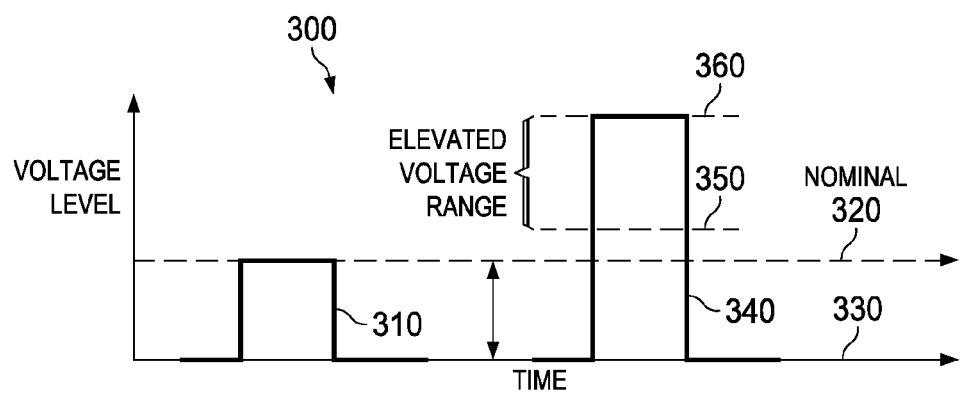
FIG. 3 illustrates an example voltage programming diagram to fix data to a non-volatile stable state in a ferroelectric random access memory.

FIG. 3 illustrates an example voltage programming diagram 300 to fix data to a non-volatile stable state in a ferroelectric random access memory. In this example, voltage read or write access levels are shown on the vertical axis versus time the voltage is applied on the horizontal access. A typical voltage pulse 310 is shown that falls between a nominal voltage range shown between lines 320 and 330. As noted previously, a voltage adjuster can set a programming read or write voltage that is applied to the one or more memory elements to an elevated voltage above the nominal voltage setting such as shown via pulse 340 to facilitate fixing the data in a faster cycle time to read or write the data the predetermined number of times. Such setting can be within a range shown between lines 350 and 360. In one example, the elevated voltage in the range can be about ten percent above the nominal voltage setting shown at 350 to less than a breakdown voltage setting shown at 360 for the one or more memory cells. Voltage levels can be adjusted higher or lower than the example ranges described herein based upon the time the pulse is applied or to adjust the number of cycles required to fix the FRAM.

Figure 4:
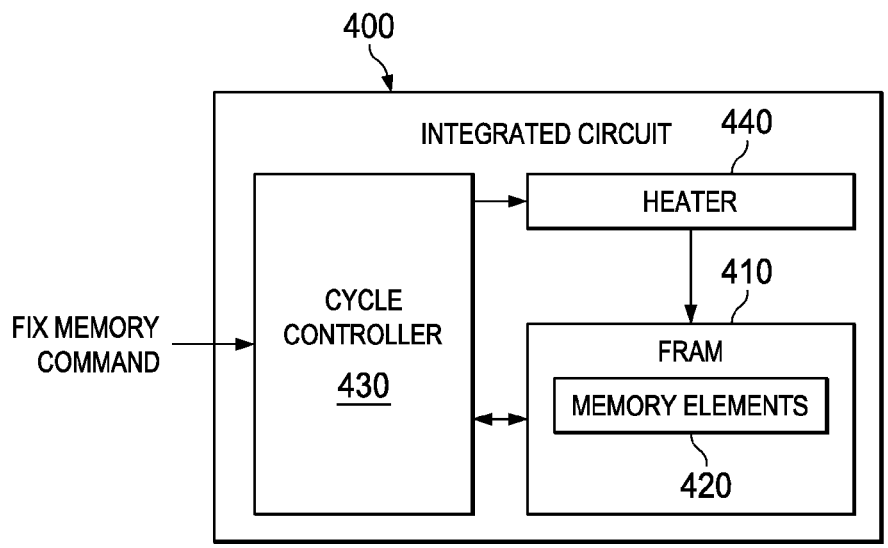
FIG. 4 illustrates an example a circuit to fix data to a non-volatile stable state in a ferroelectric random access memory.

FIG. 4 illustrates an example a circuit 400 to fix data to a non-volatile stable state in a ferroelectric random access memory. As used herein, the term circuit can include a collection of active and/or passive elements that perform a circuit function such as an analog circuit or control circuit, for example. The term circuit can also include an integrated circuit where all the circuit elements are fabricated on a common substrate, for example. The circuit 400 includes a ferroelectric random access memory (FRAM) array 410 having one or more memory elements 420 to store data. A cycle controller 430 cycles the data stored in a subset of the one or more memory elements 420 by reading or writing the data a predetermined number of times to fix the data to a non-volatile stable state. A heater 440 is controlled by the cycle controller to heat the FRAM array 410 (or portion thereof) to a predetermined temperature to facilitate fixing the data in a faster cycle time to read or write the data the predetermined number of times. As shown, an external fix memory command that specifies which portions of memory to fix can be provided to the cycle controller 430. The fix memory command can also specify the number of cycles to execute by the cycle controller 430. Although not shown, the cycle controller 430 can also include a voltage adjuster to set a programming read or write voltage applied to the one or more memory elements to an elevated voltage to read or write the data the predetermined number of times.

Figure 5:
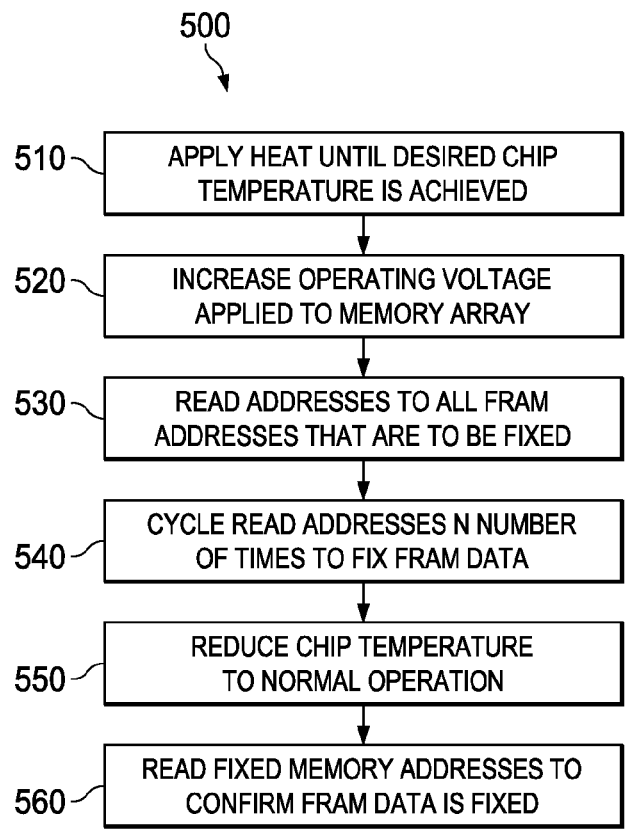
FIG. 5 illustrates an example method to fix data to a non-volatile stable state in a ferroelectric random access memory.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an IC or a controller, for example.

FIG. 5 illustrates an example method 500 to fix data to a non-volatile stable state in a ferroelectric random access memory. At 510, the method 500 includes applying heat to a ferroelectric random access memory (FRAM) array having one or more memory elements to store data (e.g., via heater 140 of FIG. 1). At 520, the method 500 includes increasing an operating voltage above a nominal voltage setting to read or write to the one or more memory cells (via voltage adjuster 160 of FIG. 1). At 530, the method 500 includes reading addresses of a subset of the one or more memory cells to be placed into a fixed non-volatile condition (e.g., via cycle controller 130 of FIG. 1). At 540, the method includes cycling the data stored in the subset of the one or more memory elements by reading the data a predetermined number of times to fix the data to the non-volatile condition (e.g., via cycle controller 130 of FIG. 1). At 550, the method 500 includes reducing chip temperature to normal operation after the cycling process of 540 (e.g., via controller 430 and heater 440 of FIG. 4). At 560, the method 500 includes reading fixed memory address to confirm FRAM data is fixed (e.g., via controller 130 of FIG. 1). The method 500 can also include cycling the data stored in the subset of the one or more memory elements by reading the data in a range of about 5 cycles to about 10,000 cycles. The method 500 can include increasing the operating voltage applied to the one or more memory cells to an elevated voltage about ten percent above the nominal voltage setting and less than a breakdown voltage setting for the one or more memory elements to facilitate fixing the data in a faster cycle time to read the data the predetermined number of times.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method comprising:

applying heat, via a heater controlled by a controller, to a ferroelectric random access memory (FRAM) array having one or more memory elements;

cycling data, via the controller, to be fixed in the one or more memory elements by reading the data a predetermined number of times at an elevated voltage to fix the data to a non-volatile condition, the predetermined number of times being a number greater than or equal to three; and setting, via the controller, an operating voltage for reading the one or more memory cells to the elevated voltage when fixing the data, the elevated voltage being greater than a nominal voltage setting used for reading data when not fixing the data.

2. The method of claim 1, further comprising cycling the data stored in the one or more memory elements by reading the data in a range of about 5 cycles to about 10,000 cycles.

3. The method of claim 2, wherein setting the operating voltage includes setting the operating voltage applied to the one or more memory cells to an elevated voltage about ten percent above the nominal voltage setting and less than a breakdown voltage setting for the one or more memory elements to facilitate fixing the data in fewer cycles to read the data the predetermined number of times.

* * * * *